US012813351B2

(12) United States Patent
(10) Patent No.: US 12,813,351 B2
(45) Date of Patent: Nov. 24, 2026

Ma et al.

(54) LIGHT-EMITTING SUBSTRATE COMPRISES PLURALITY OF LIGHT EMITTING UNITS INCLUDING MULTIPLE LIGHT EMITTING ELEMENTS AND DISPLAY APPARATUS

(71) Applicants: Hefei BOE Optoelectronics Technology Co., Ltd., Hefei (CN); BOE Technology Group Co., Ltd., Beijing (CN)

(72) Inventors: Xinchen Ma, Beijing (CN); Dayu Zhang, Beijing (CN); Zhiwei Zhang, Beijing (CN); Yanjiao Pan, Beijing (CN); Zhaobo Jiang, Beijing (CN); Chengwei Li, Beijing (CN); Jianqiu Zeng, Beijing (CN); Beibei Shao, Beijing (CN); Rui Liu, Beijing (CN); Daoran Gong, Beijing (CN); Aobo Zhou, Beijing (CN); Yunming Lu, Beijing (CN)

(73) Assignees: Hefei BOE Optoelectronics Technology Co., Ltd., Hefei (CN); Beijing BOE Technology Development Co., Ltd., Beijing (CN)

( * ) Notice: Subject to any disclaimer, the term of this patent is extended or adjusted under 35 U.S.C. 154(b) by 384 days.

(21) Appl. No.: 18/574,953

(22) PCT Filed: Nov. 25, 2021

(86) PCT No.: PCT/CN2021/133261
§ 371 (c)(1),
(2) Date: Dec. 28, 2023

(87) PCT Pub. No.: WO2023/092410
PCT Pub. Date: Jun. 1, 2023

(65) Prior Publication Data

US 2024/0312965 A1 Sep. 19, 2024

(51) Int. Cl.
*H10W 90/00* (2026.01)
*H10H 20/857* (2025.01)

(52) U.S. Cl.
CPC .......... *H10W 90/00* (2026.01); *H10H 20/857* (2025.01)

(58) Field of Classification Search
CPC ..... G02F 1/1336; H10W 90/00; H10W 40/00; H10H 20/857; H10H 20/00
(Continued)

(56) References Cited

U.S. PATENT DOCUMENTS 10,527,886 B1 1/2020 Lin et al.
11,024,609 B2 6/2021 Kong et al.
(Continued)

FOREIGN PATENT DOCUMENTS

CN 109031779 A 12/2018
CN 110658651 A * 1/2020 ....... G02F 1/133603
(Continued)

OTHER PUBLICATIONS

Aug. 23, 2023—(TW) Notice of First Office Action—App 111143531 and English Translation.

*Primary Examiner* — Didarul A Mazumder
(74) *Attorney, Agent, or Firm* — Banner & Witcoff, Ltd.

(57) ABSTRACT

Embodiments of the present disclosure relates to a light emitting substrate and a display device. The light emitting substrate includes a substrate; a plurality of light emitting units on the substrate, at least one of the plurality of light emitting units includes at least two light emitting element strings, and the at least two light emitting element strings are connected in parallel with each other; and a same light emitting element string includes at least two light emitting elements sequentially connected in series; in a same light emitting unit, a plurality of elements are distributed in an
(Continued)

array, and the same light emitting unit includes at least two light emitting elements connected in series and located in different rows, and further includes at least two light emitting elements connected in series and located in different columns.

18 Claims, 14 Drawing Sheets

(58) Field of Classification Search
USPC ............................ 257/88; 438/22, 24, 46, 47
See application file for complete search history.

(56) References Cited

U.S. PATENT DOCUMENTS

2014/0091337 A1* 4/2014 Ooyabu ............... H10H 20/852 257/99
2014/0146533 A1* 5/2014 Yano ......................... F21K 9/23 362/249.14
2014/0169037 A1 6/2014 Berard et al.
2020/0035147 A1 1/2020 Ban et al.
2022/0005990 A1* 1/2022 Su ......................... H10W 72/50
2022/0365392 A1 11/2022 Liu

FOREIGN PATENT DOCUMENTS

| | | | |
|---|---|---|---|
| CN | 111999936 | A | 11/2020 |
| CN | 112533374 | A | 3/2021 |
| CN | 112599511 | A | 4/2021 |
| CN | 113035848 | A | 6/2021 |
| CN | 113287059 | A | 8/2021 |
| CN | 113433735 | A | 9/2021 |
| TW | 201312727 | A | 3/2013 |
| TW | 201432861 | A | 8/2014 |

* cited by examiner

LIGHT-EMITTING SUBSTRATE COMPRISES PLURALITY OF LIGHT EMITTING UNITS INCLUDING MULTIPLE LIGHT EMITTING ELEMENTS AND DISPLAY APPARATUS

The application is a U.S. National Phase Entry of International Application No. PCT/CN2021/133261 filed Nov. 25, 2021, designating the United States of America. The present application claims priority to and the benefit of the above-identified application and the above-identified application is incorporated by reference herein in its entirety.

TECHNICAL FIELD

The present disclosure relates to the technical field of semiconductors, and in particular to a light emitting substrate and a display device.

BACKGROUND

In the past two years, display devices with ultra-high contrast (>20000) and ultra-high brightness (peak brightness of 1000/1400 nit) have become the development trend of the display industry, resulting in popularity of light emitting diodes (e.g., mini LED). Various display panel manufacturers have invested in R&D resources one after another, which has accelerated the process of LED productization.

SUMMARY

Embodiments of the present disclosure relates to a light emitting substrate and a display device. The light emitting substrate comprises a substrate; a plurality of light emitting units on the substrate, at least one of the plurality of light emitting units comprises at least two light emitting element strings, and the at least two light emitting element strings are connected in parallel with each other; and a same light emitting element string comprises at least two light emitting elements sequentially connected in series; in a same light emitting unit, a plurality of light emitting elements are distributed in an array, and the same light emitting unit comprises at least two light emitting elements connected in series and located in different rows, and further comprises at least two light emitting elements connected in series and located in different columns.

In a possible implementation method, in the same light emitting unit, at least one column of light emitting elements comprise at least one light emitting element of a first light emitting element string and at least one light emitting element of a second light emitting element string, and the first light emitting element string and the second light emitting element string are different light emitting element strings in the same light emitting unit.

In a possible implementation method, in the same light emitting unit, at least one row of light emitting elements comprise at least one light emitting element of a third light emitting element string and at least one light emitting element of a fourth light emitting element string, and the third light emitting element string and the fourth light emitting element string are different light emitting element strings in the same light emitting unit.

In a possible implementation method, in the same light emitting unit, counts of light emitting elements of different light emitting element strings are the same; a light emitting element at a start of each of the light emitting element strings is located in a same row or in a same column.

In a possible implementation method, in the same light emitting unit, a distance between any two adjacent light emitting elements in any row of light emitting elements along a row direction is equal; and/or, in the same light emitting unit, a distance between any two adjacent light emitting elements in any column of light emitting elements along a column direction is equal.

In a possible implementation method, at least one of the light emitting element strings comprises at least two light emitting elements sequentially connected in series; and any two adjacent light emitting elements in at least one of the light emitting element strings are located in different rows and different columns.

In a possible implementation method, the same light emitting unit comprises N light emitting element strings; the N light emitting element strings are formed as a light emitting element array with N columns and M rows, where N≥2, M≥2 and M≥N, and each column of light emitting elements comprises at least one light emitting element of each of the light emitting element strings; or, the N light emitting element strings are formed as a light emitting element array with N rows and M columns, where N≥2, M≥2 and M≥N, and each row of light emitting elements comprises at least one light emitting element of each of the light emitting element strings.

In a possible implementation method, in the same light emitting unit, a row direction and a column direction defined by the light emitting elements are perpendicular to each other.

In a possible implementation method, the plurality of the light emitting units are arranged in an array, a row direction of an array arrangement of the light emitting units is parallel to a row direction of the light emitting elements in the light emitting units, and a column direction of the array arrangement of the light emitting units is parallel to a column direction of the light emitting elements in the light emitting units.

In a possible implementation method, in a light emitting element array formed by the light emitting elements of the plurality of light emitting units, a distance between two adjacent light emitting elements in any column along the column direction is equal, and a distance between two adjacent light emitting elements in any row along the row direction is equal.

In a possible implementation method, in each of the plurality of light emitting units, one of a cathode or an anode of a light emitting element at a start of each of the light emitting element strings is connected to a first wire, and the other of a cathode or an anode of a light emitting element at an end of each of the light emitting element strings is connected to a second wire; first wires corresponding to at least two light emitting units are electrically connected, and second wires corresponding to at least two light emitting units are electrically connected through a third wire.

In a possible implementation method, among the light emitting units located in a same row, first wires corresponding to all the light emitting units are a same wire.

In a possible implementation method, among the light emitting units in a same column, second wires corresponding to at least two light emitting units are electrically connected to a same third wire.

In a possible implementation method, first wires corresponding to at least two rows of light emitting units are connected to a same fourth wire; the fourth wire comprises a first extension portion extending along the column direction, and a size of the fourth wire along the row direction is greater than a size of the third wire along the row direction.

In a possible implementation method, the first wire comprises a portion extending along the row direction, the third wire comprises a portion extending along the column direction, and a size of the first wire along the column direction is greater than the size of the third wire along the row direction.

In a possible implementation method, the light emitting substrate comprises a first wiring layer located between the plurality of light emitting elements and the substrate, and further comprises a second wiring layer located at a side of the substrate away from the first wiring layer, and the first wire and the second wire are located in the first wiring layer, and the third wire is located in the second wiring layer.

In a possible implementation method, the light emitting substrate further comprises a fifth wire located in a same light emitting element string and connecting two light emitting elements in series, and the fifth wire is located in the first wiring layer.

In a possible implementation method, the first wiring layer further comprises an alignment hollow block adjacent to at least part of the plurality of light emitting elements.

In a possible implementation method, the second wiring layer further comprises a plurality of heat dissipation blocks separated from each other, and the plurality of heat dissipation blocks are provided with grid-shaped hollow grooves.

In a possible implementation method, an area of an orthographic projection of the hollow grooves on the substrate accounts for one tenth to one third of an area of an orthographic projection of the plurality of heat dissipation blocks on the substrate.

In a possible implementation method, wires in the second wiring layer are arranged in a same layer as the plurality of heat dissipation blocks, and orthographic projections of the wires in the second wiring layer on the substrate at least partially overlap with orthographic projections of the hollow grooves on the substrate.

In a possible implementation method, a material of the plurality of heat dissipation blocks is a conductive material, and the plurality of heat dissipation blocks are insulated from the wires in the second wiring layer.

In a possible implementation method, a plurality of hollow grooves in at least certain regions are distributed in a cross and saltire shape.

Embodiments of the present disclosure further provide a light emitting substrate, which comprises: a substrate; at least two light emitting element strings on the substrate, a same light emitting element string comprises at least two light emitting elements sequentially connected in series; and a plurality of light emitting elements comprised in the at least two light emitting element strings are distributed in an array, and at least two light emitting elements connected in series are located in different rows and different columns.

Embodiments of the present disclosure further provide a display device, which comprises the light emitting substrate according to any one of the embodiments mentioned above, and further comprises a display panel located at a light-exiting side of the light emitting substrate.

BRIEF DESCRIPTION OF DRAWINGS

FIG. 9 is a schematic diagram of a single film layer of a first wiring layer in

FIG. 8;

DETAILED DESCRIPTION

Figure 1:
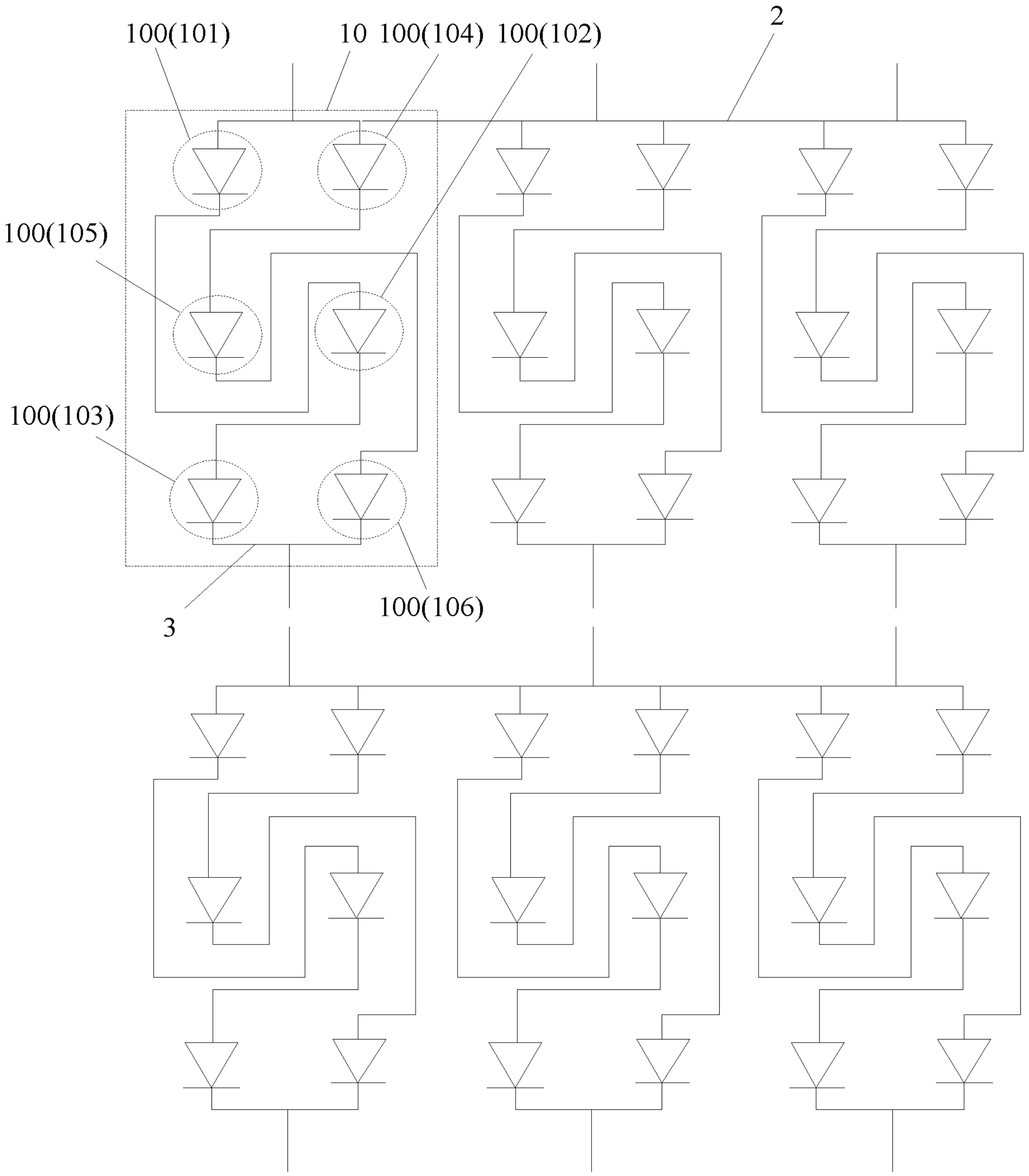
FIG. 1 is a schematic diagram of an arrangement of light emitting elements of a light emitting substrate provided by an embodiment of the present disclosure.

In order to make objects, technical details and advantages of the embodiments of the present disclosure apparent, the technical solutions of the embodiments will be described in a clearly and fully understandable way in connection with the drawings related to the embodiments of the present disclosure. Apparently, the described embodiments are just a part but not all of the embodiments of the present disclosure. Based on the described embodiments herein, those skilled in the art can obtain other embodiment(s), without any inventive work, which should be within the scope of the present disclosure.

Unless otherwise defined, all the technical and scientific terms used herein have the same meanings as commonly understood by one of ordinary skill in the art to which the present disclosure belongs. The terms "first," "second," etc., which are used in the description and the claims of the present application for invention, are not intended to indicate any sequence, amount or importance, but distinguish various components. The terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

In order to keep the following descriptions of the embodiments of the present disclosure clear and concise, the present disclosure omits detailed descriptions of well-known functions and well-known components.

The light emitting diode (e.g., mini light emitting diode and/or micro light emitting diode) backlight can be divided into two types: one-parallel multi-series and multi-parallel multi-series (also referred to as high-voltage low-current and low-voltage high-current, here high and low are relative to each other) based on the partition series parallel connection method. One-parallel multi-series can be understood as that all light emitting diodes (LEDs) in a partition are connected in series; the advantage is that the current flowing through all the LEDs are of the same magnitude and the brightness uniformity is good; the disadvantage is that the scalability of the product is poor, mainly reflected in: when the brightness of the product needs to be improved, the current of the backlight needs to be increased, but the on-state voltage drop (VF) of the LED is also increased while the current is increased; however, the output voltage of the LED driving structure is limited (limited by the IC manufacturing process), so it is impossible to directly increase the current on the original light board. In this case, it is necessary to redesign the light board into a multi-parallel multi-series structure, which consumes design and verification costs. Correspondingly, the multi-parallel multi-series structure means that the LEDs in a partition have more than one series, the number of LED lights in each series is equal to that of other series, and different series are in parallel relationship with each other. However, due to the difference between LED individuals, the current flowing through different light strings in the same partition under the same voltage varies; while the brightness is directly proportional to the current, the problem of uneven brightness of different light strings, that is, the phenomenon of "current imbalance", will occur.

Figure 2:
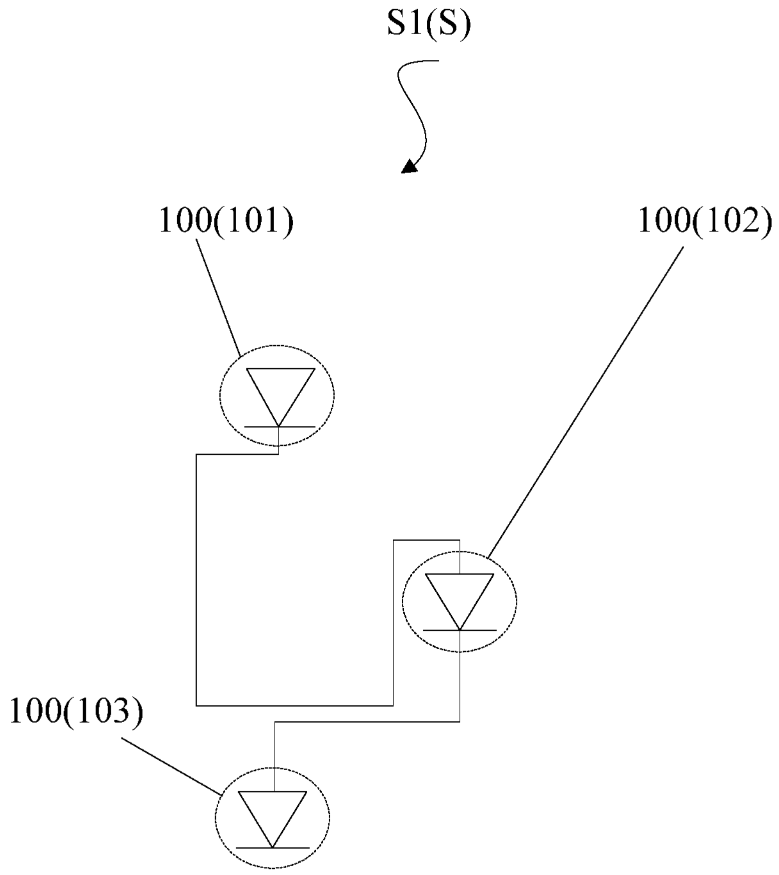
FIG. 2 is a schematic diagram of one light emitting element string in the light emitting unit of FIG. 1.
Figure 3:
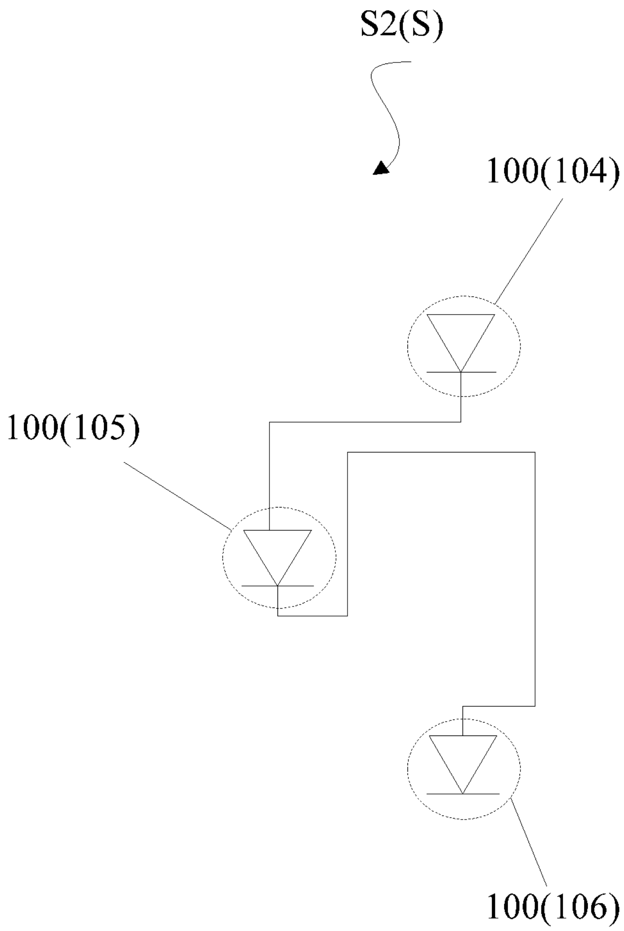
FIG. 3 is a schematic diagram of another light emitting element string in the light emitting unit of FIG. 1.
Figure 4:
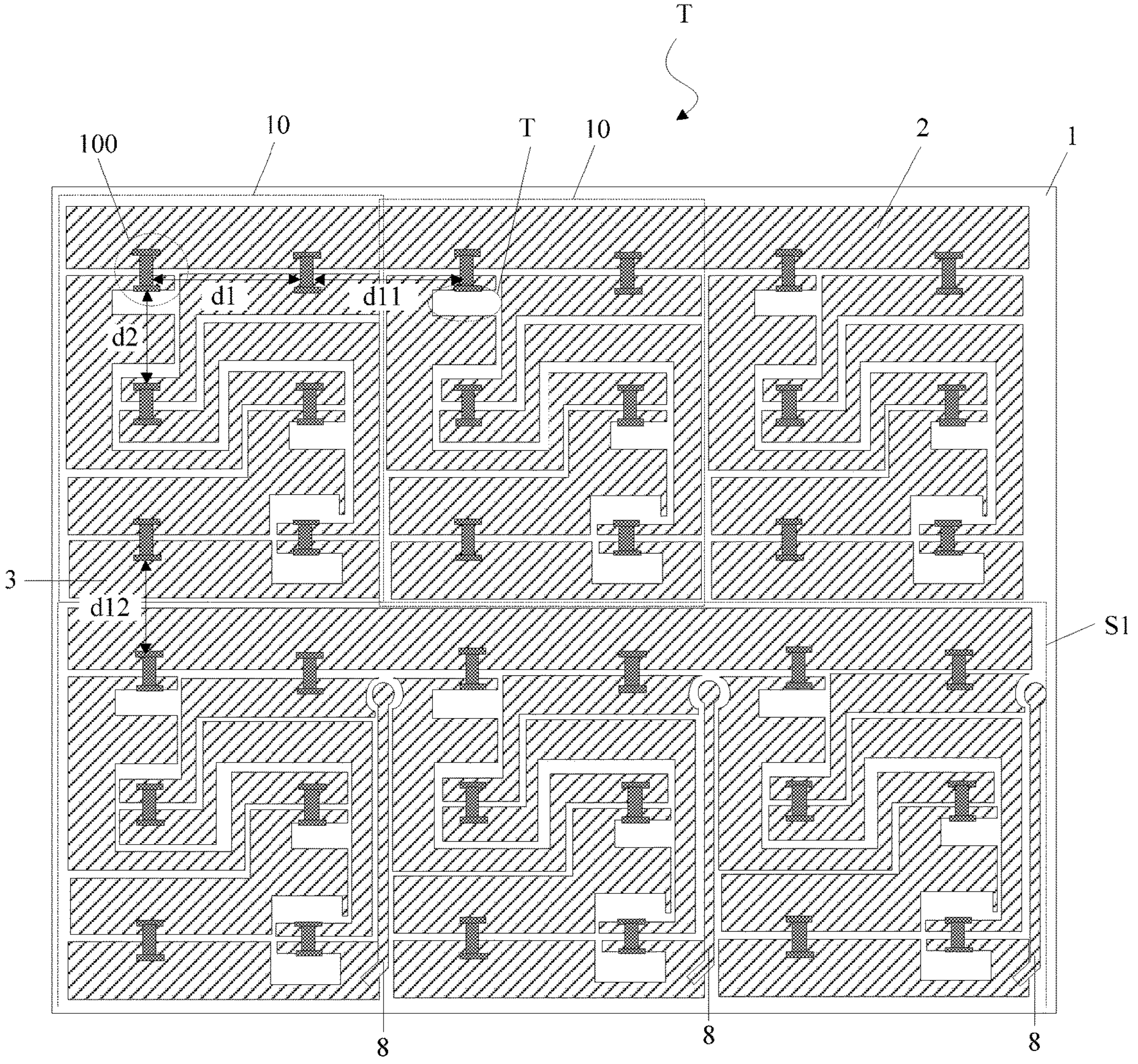
FIG. 4 is a schematic diagram of partial wiring of a light emitting substrate provided by an embodiment of the present disclosure.

In view of this, referring to FIG. 1, FIG. 2, FIG. 3 and FIG. 5, FIG. 1 is a schematic diagram of an arrangement of a plurality of light emitting elements of a light emitting substrate, FIG. 2 is a schematic diagram of one light emitting element string in the light emitting unit of FIG. 1, FIG. 3 is another light emitting element string in the light emitting unit of FIG. 1, and FIG. 4 is a schematic diagram of partial wiring of a light emitting substrate. An embodiment of the present disclosure provides a light emitting substrate, which includes:

a substrate 1;

a plurality of light emitting units 10 located on the substrate 1, in which at least one light emitting unit 10 includes at least two light emitting element strings S, and the at least two light emitting element strings S are connected in parallel with each other; and the same light emitting element string S includes at least two light emitting elements 100 sequentially connected in series. Specifically, for example, as shown in FIG. 2 and FIG. 3, the light emitting unit 10 includes two light emitting element strings S, namely a first light emitting element string S1 and a second light emitting element string S2; the first light emitting element string S1 includes a first light emitting element 101, a second light emitting element 102 and a third light emitting element 103 which are sequentially connected in series, and the second light emitting element string S2 includes a fourth light emitting element 104, a fifth light emitting element 105 and a sixth light emitting element which are sequentially connected in series.

In the same light emitting unit 10, a plurality of light emitting elements 100 are distributed in an array. For example, as shown in FIG. 1, the plurality of light emitting elements 100 are distributed in three rows and two columns. The same light emitting unit 10 includes at least two light emitting elements 100 connected in series and located in different rows, and further includes at least two light emitting elements 100 connected in series and located in different columns. For example, as shown in FIG. 1, the same light emitting unit 10 includes the first light emitting element 101 and the second light emitting element 102 connected in series and located in different rows, and further includes the fourth light emitting element 104 and the fifth light emitting element 105 connected in series and located in different columns.

In the embodiment of the present disclosure, the plurality of light emitting elements 100 in the same light emitting unit 10 are distributed in an array, and the same light emitting unit 10 includes at least two light emitting elements 100 connected in series and located in different rows, and further includes at least two light emitting elements 100 connected in series and located in different columns, so that any two adjacent light emitting elements 100 in the same light emitting element string S can be located in different rows and different columns. Because the current of the same light emitting element string S is the same, even if the phenomenon of current imbalance occurs to different light emitting element strings S, the arrangement manner of the light emitting elements 100 provided by the embodiment of the present disclosure can ensure that the light emitting elements 100 with different brightness will not be clustered together to form regular bright and dark stripes, but the light emitting elements 100 with different brightness are in a disperse distribution, thus weakening the bright and dark differences of different light emitting element strings S in the same light emitting unit from the sense of view, and greatly improving the problem of uneven brightness in the same light emitting unit 10.

In a possible implementation method, in the same light emitting unit 10, at least one column of light emitting elements 100 includes at least one light emitting element 100 of a first light emitting element string S1 and at least one light emitting element 100 of a second light emitting element string S2. Specifically, for example, as shown in FIG. 1, FIG. 2 and FIG. 3, in the same light emitting unit 10, the light emitting elements 100 in the left column include a first light emitting element 101 of the first light emitting element string S1, and further includes a fifth light emitting element 105 of the second light emitting element string S2; and the first light emitting element string S1 and the second light emitting element string S2 are different light emitting element strings S in the same light emitting unit 10. In the embodiment of the present disclosure, in the same light emitting unit 10, at least one column of light emitting elements 100 includes at least one light emitting element 100 of the first light emitting element string S1 and at least one light emitting element 100 of the second light emitting element string S2, so that the light emitting elements 100 in the same column include the light emitting elements 100 of different light emitting element strings S, thus avoiding forming bright and dark stripes in the column direction due to clustering of light emitting elements 100 with different brightness.

In a possible implementation method, in the same light emitting unit 10, at least one row of light emitting elements 100 includes at least one light emitting element 100 of a third light emitting element string and at least one light emitting element 100 of a fourth light emitting element string, and the third light emitting element string and the fourth light emitting element string are different light emitting element strings in the same light emitting unit 10. Specifically, the third light emitting element string can be the same light emitting element string S as the first light emitting element string S1 or the second light emitting element string S2, or can be a light emitting element string S different from the first light emitting element string S1 or the second light emitting element string S2; and correspondingly, the fourth light emitting element string S4 can be the same light emitting element string S as the first light emitting element string S1 or the second light emitting element string S2, or can be a light emitting element string S different from the first light emitting element string S1 or the second light emitting element string S2. In a possible implementation method, the third light emitting element string S3 is the same light emitting element string S as the first light emitting element string S1, and the fourth light emitting element string S4 is the same light emitting element string S as the second light emitting element string S2. Specifically, for example, in the same light emitting unit 10 shown in FIG. 1, the light emitting elements 100 in the first row include a first light emitting element 101 of a first light emitting element S1 (i.e. a third light emitting element string), and a fourth light emitting element 104 of a second light emitting element string S2 (i.e. a fourth light emitting element string).

In a possible implementation method, the same light emitting unit 10 includes N light emitting element strings S;

the N light emitting element strings S are formed as a light emitting element array with N columns and M rows, where N≥2, M≥2 and M≥N, and each column of light emitting elements 10 includes at least one light emitting element 10 of each of the light emitting element string S. Specifically, for example, as shown in FIG. 1, FIG. 2 and FIG. 3, the same light emitting unit 10 includes two light emitting element strings S, namely, a first light emitting element string S1 and a second light emitting element string S2. The first light emitting element string S1 includes a first light emitting element 101, a second light emitting element 102 and a third light emitting element 103, and the second light emitting element string S2 includes a fourth light emitting element 104, a fifth light emitting element 105 and a sixth light emitting element 106. The two light emitting element strings are formed as a light emitting element array with two columns and three rows. The first column of light emitting elements from the left includes two light emitting elements of the first light emitting element string S1 (i.e., the first light emitting element 101 and the third light emitting element 103) and one light emitting element of the second light emitting element string S2 (i.e., the fifth light emitting element 105), and the second column of light emitting elements from the left includes one light emitting element of the first light emitting element string S1 (i.e., the second light emitting element 102) and two light emitting elements of the second light emitting element string S2 (i.e., the fourth light emitting element 104 and the sixth light emitting element 106).

Figure 5:
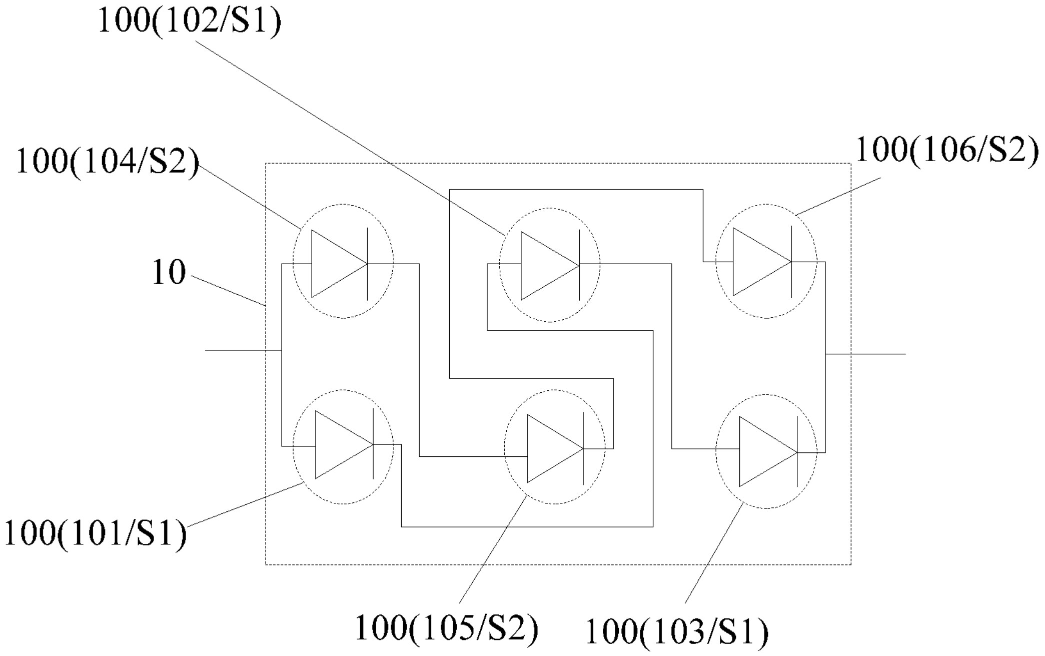
FIG. 5 is a schematic diagram of another arrangement of light emitting units.

Alternatively, the N light emitting element strings are formed as a light emitting element array with N rows and M columns, where N≥2, M≥2 and M≥N, and each row of light emitting elements 10 includes at least one light emitting element 10 of each of the light emitting element strings S. Specifically, for example, as shown in FIG. 5, the same light emitting unit 10 includes two light emitting element strings S, namely a first light emitting element string S1 and a second light emitting element string S2. The first light emitting element string S1 includes a first light emitting element 101, a second light emitting element 102 and a third light emitting element 103, and the second light emitting element string S2 includes a fourth light emitting element 104, a fifth light emitting element 105 and a sixth light emitting element 106. The two light emitting element strings are formed as a light emitting element array with two rows and three columns. The second row of the light emitting elements on the lower side include two light emitting elements of the first light emitting element string S1 (i.e., the first light emitting element 101 and the third light emitting element 103) and one light emitting element of the second light emitting element string S2 (i.e., the fifth light emitting element 105), and the first row of the light emitting elements on the upper side include one light emitting element of the first light emitting element string S1 (i.e., the second light emitting element 102) and two light emitting elements of the second light emitting element string S2 (i.e., the fourth light emitting element 104 and the sixth light emitting element 106).

In a possible implementation method, in the same light emitting unit 10, numbers of the light emitting elements 100 of different light emitting element strings S are the same; the light emitting element 100 at the start of each of the light emitting element strings S is located in the same row or column. Specifically, for example, as shown in FIG. 1, the first light emitting element string S1 includes three light emitting elements 100, the second light emitting element string S2 also includes three light emitting elements 100, and the number of light emitting elements in the first light emitting element string S1 is the same as the number of light emitting elements in the second light emitting element string S2; and the light emitting element 100 at the start of the first light emitting element string S1 (i.e. the first light emitting element 101) and the light emitting element 100 at the start of the second light emitting element string S2 (i.e. the fourth light emitting element 104) are located in the same row, as shown in FIG. 1. The light emitting element 100 at the start of the first light emitting element string S1 (i.e. the first light emitting element 101) and the light emitting element 100 at the start of the second light emitting element string S2 (i.e. the fourth light emitting element 104) can also be located in the same column, as shown in FIG. 5. In the embodiment of the present disclosure, the light emitting elements 100 at the start of each of the light emitting element strings S are located in the same row or column, which is convenient to connect the light emitting elements 100 at the start of different light emitting element strings S in parallel and is helpful to save the wiring space of the light emitting substrate.

In a possible implementation method, as shown in FIG. 4, in the same light emitting unit 10, the distance d1 between any two adjacent light emitting elements 100 in any row of light emitting elements 100 along the row direction is equal. In a possible implementation method, in the same light emitting unit 10, the distance d2 between any two adjacent light emitting elements 100 in any column of light emitting elements 100 along the column direction is equal. In the embodiment of the present disclosure, in the same light emitting unit 10, the distance d1 between any two adjacent light emitting elements 100 in any row of the light emitting elements 100 along the row direction is equal, and the distance d2 between any two adjacent light emitting elements 100 in any column of the light emitting elements 100 along the column direction is equal, which is helpful to realize the uniformity of luminous brightness in the same light emitting unit 10.

In a possible implementation method, as shown in FIG. 4, in a light emitting element array formed by the light emitting elements 100 of the plurality of light emitting units 10, distances d12 between any two adjacent light emitting elements 100 in any column along the column direction are equal, and distances d11 between any two adjacent light emitting elements 100 in any row along the row direction are equal.

In a possible implementation method, as shown in FIGS. 1 to 5, at least one light emitting element string S includes at least two light emitting elements 100 sequentially connected in series; and any two adjacent light emitting elements 100 in at least one light emitting element string S are located in different rows and different columns. Specifically, for example, in FIG. 1, each of the light emitting element strings S includes three light emitting elements 100 sequentially connected in series; and in the first light emitting element string S1, the first light emitting element 101 and the second light emitting element 102 adjacent to each other are located in different rows and different columns, and the second light emitting element 102 and the third light emitting element 103 adjacent to each other are located in different rows and different columns. In the embodiment of the present disclosure, any two adjacent light emitting elements 100 in at least one light emitting element string S are located in different rows and different columns, so that different light emitting element strings S in the same light emitting unit 10 can be more fully cross-distributed, which is helpful to realize the uniformity of luminous brightness in the same light emitting unit 10.

It should be noted that, in terms of any two adjacent light emitting elements 100 in the light emitting element string S, “adjacent” is not adjacent in spatial position relationship, but adjacent in electrical connection relationship; that is, in one light emitting element string S, the two light emitting elements 10 are directly electrically connected through a conductor.

In a possible implementation method, as shown in FIGS. 1 to 5, in the same light emitting unit 10, the row direction and the column direction defined by the light emitting elements 100 are perpendicular to each other. In the embodiment of the present disclosure, in the same light emitting unit 10, the row direction and the column direction defined by the light emitting elements 100 are perpendicular to each other, thus facilitating the transfer of the light emitting elements 100 and simplifying the manufacturing process of the light emitting substrate.

In a possible implementation method, as shown in FIG. 1 or FIG. 4, the plurality of light emitting units 10 are arranged in an array, and the row direction of the array arrangement of the light emitting units 10 is parallel to the row direction of the light emitting elements 100 in the light emitting units 10, and the column direction of the array arrangement of the light emitting units 10 is parallel to the column direction of the light emitting elements 100 in the light emitting units 10, thus facilitating the transfer of light emitting elements 100 on the same light emitting substrate.

Figure 8:
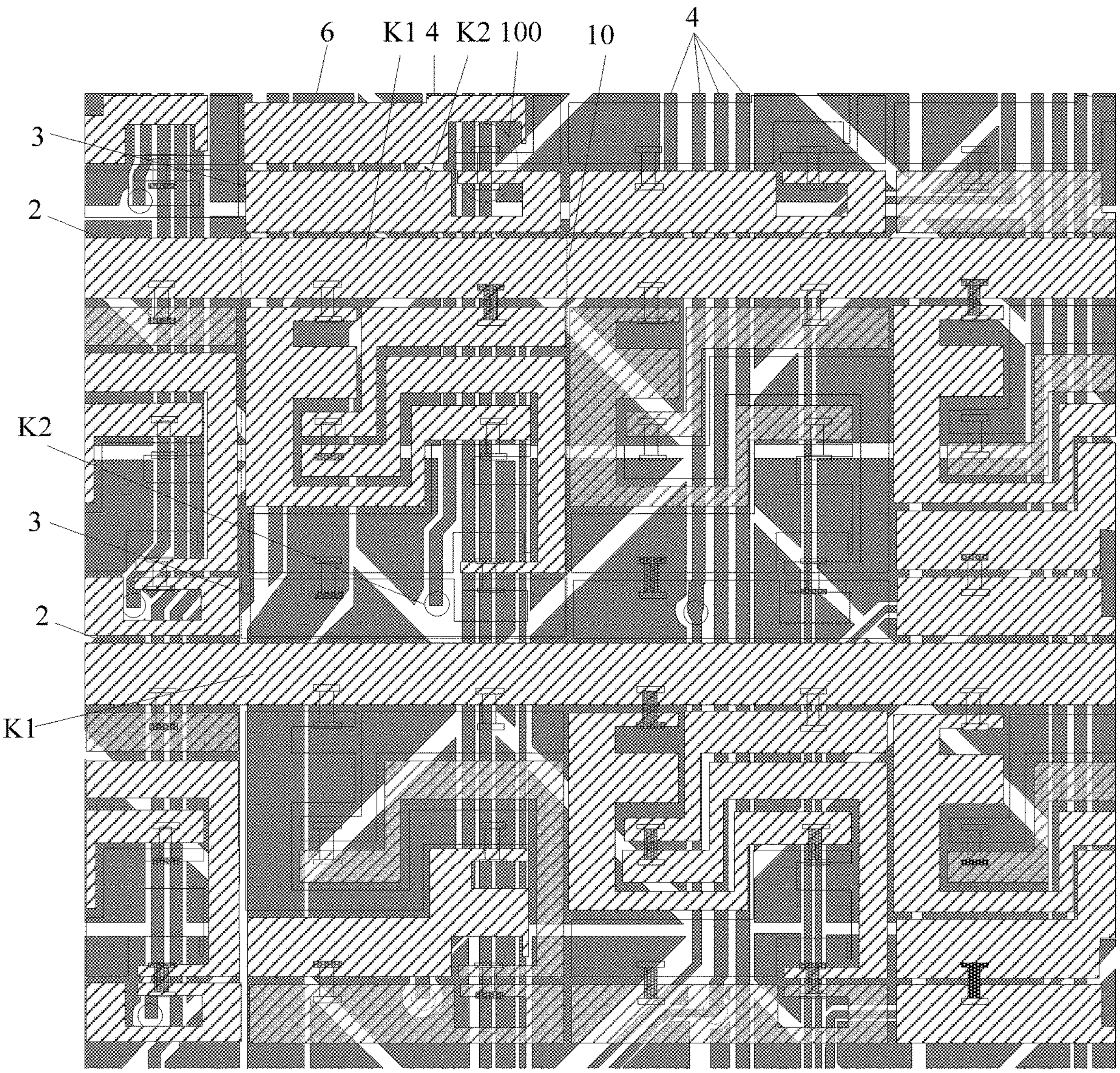
FIG. 8 is a partial enlarged wiring schematic diagram of a light emitting substrate.
Figure 9:
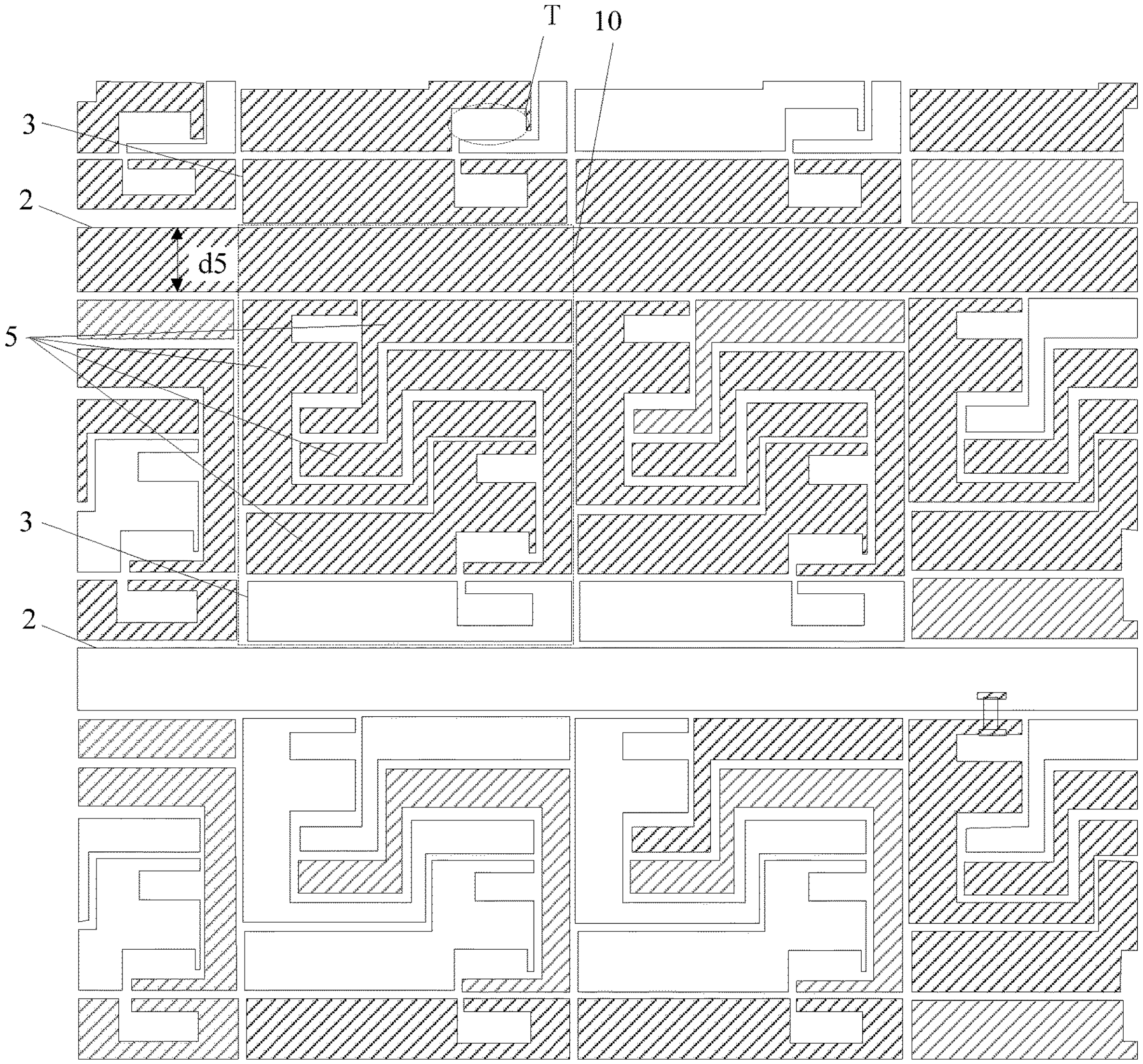
Figure 10:
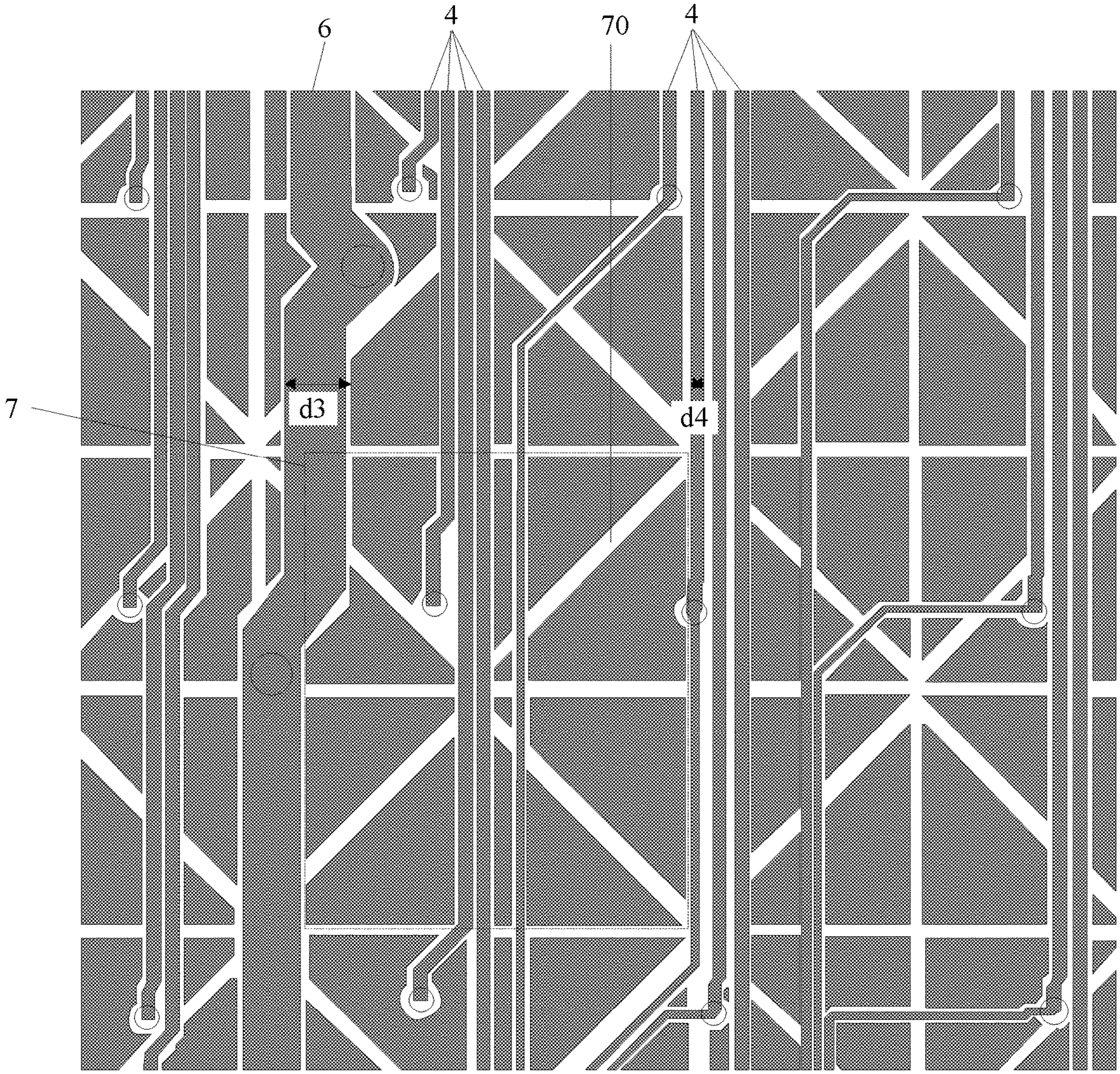
FIG. 10 is a schematic diagram of a single film layer of a second wiring layer in FIG. 8.
Figure 11:
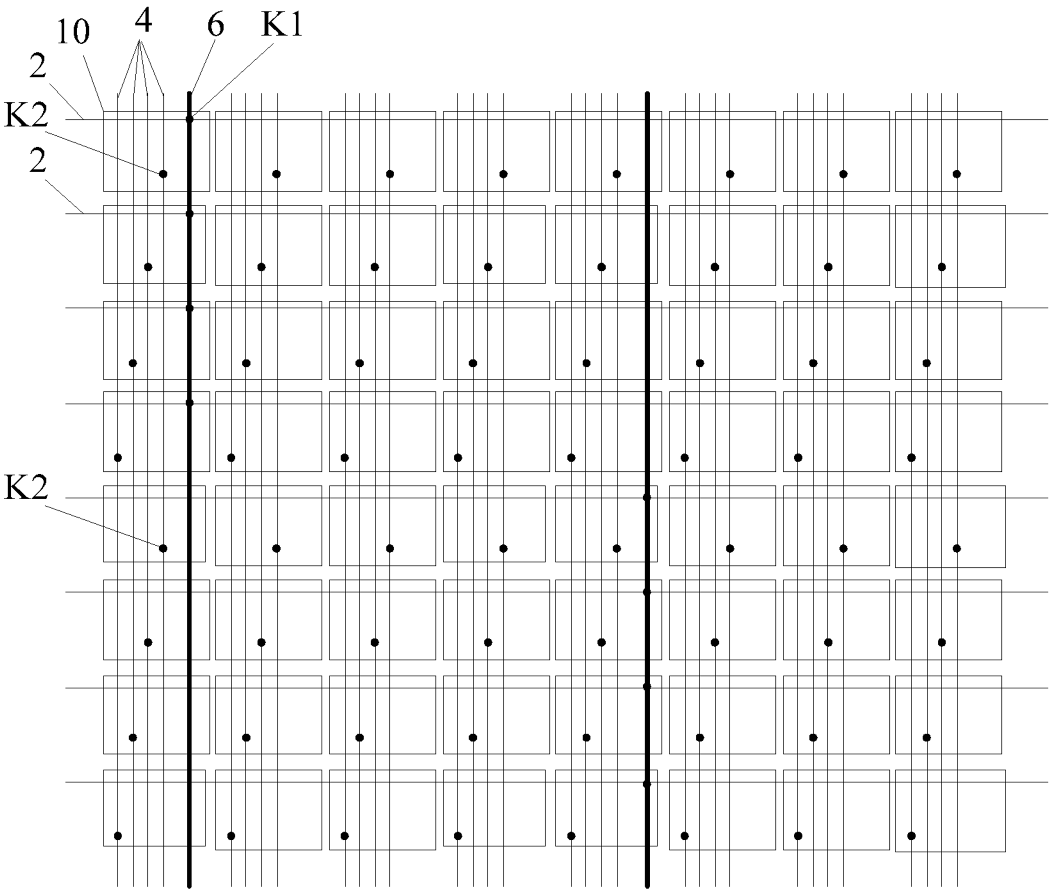
FIG. 11 is a schematic diagram of wiring connection of a light emitting substrate.

In a possible implementation method, referring to FIG. 7, FIG. 8, FIG. 9, FIG. 10 and FIG. 11, FIG. 8 is a partial enlarged wiring schematic diagram of a light emitting substrate, FIG. 9 is a schematic diagram of a single film layer of a first wiring layer in FIG. 8, FIG. 10 is a schematic diagram of a single film layer of a second wiring layer in FIG. 8, and FIG. 11 is a schematic diagram of wiring connection of a light emitting substrate. The light emitting substrate includes a first wiring layer T located between the light emitting elements 100 and the substrate 1, and further includes a second wiring layer B located at one side of the substrate 1 away from the first wiring layer T. As shown in FIG. 1, in each of the light emitting units 10, one of a cathode or an anode of the light emitting element at the start of each of the light emitting element strings S is connected to a first wire 2, and the other of a cathode or an anode of the light emitting element at the end of each of the light emitting element strings S is connected to a second wire. As shown in FIG. 1, FIG. 4, FIG. 8 or FIG. 9, the first wires 2 corresponding to at least two light emitting units 10 are electrically connected. Specifically, for example, the electrical connection here can include that the at least two light emitting units 10 are correspondingly connected to the same first wire 2. As shown in FIG. 8 or FIG. 11, the second wires 3 corresponding to at least two light emitting units 10 are electrically connected through a third wire 4. Specifically, the second wire 3 can be located in the first wiring layer T, the third wire 4 can be located in the second wiring layer B, and the second wire 3 can be electrically connected to the third wire 4 through a second via K2 penetrating the substrate 1.

In a possible implementation method, as shown in FIG. 1, FIG. 4 and FIG. 8, among the light emitting units 10 in the same row, the first wires 2 corresponding to all the light emitting units 10 are the same wire, thus being helpful to save the wiring space of the light emitting substrate and reducing the complexity of wiring of the light emitting substrate.

In a possible implementation method, as shown in FIG. 8 or FIG. 11, among the light emitting units 10 in the same column, the second wires 3 corresponding to at least two light emitting units 10 are electrically connected to the same third wire 4.

In a possible implementation method, as shown in FIG. 8, FIG. 9 or FIG. 11, the first wires 2 corresponding to at least two rows of light emitting units 10 are connected to the same fourth wire 6. Specifically, the first wire 2 can be located in the first wiring layer T, the fourth wire 6 can be located in the second wiring layer B, and the second wire 2 can be electrically connected to the fourth wire 6 through a via hole K1 penetrating the substrate 1. Referring to FIG. 10, the fourth wire 6 includes a first extension portion extending along the column direction, and a size d3 of the fourth wire 6 along the row direction is greater than a size d4 of the third wire 4 along the row direction. Thus, in the case where the first wire 2 provides anode/cathode signal for the entire row of light emitting units 10, the wire width d3 of the fourth wire 6 is set wider, which can effectively reduce the voltage drop on the wire during signal transmission.

In a possible implementation method, as shown in FIG. 8, FIG. 10 or FIG. 11, the first wire 2 includes a portion extending along the row direction, and the third wire 4 includes a portion extending along the column direction, and a size d5 of the first wire 2 along the column direction is greater than the size d4 of the third wire 4 along the row direction.

It should be noted that FIG. 11 is only intended to illustrate the connection relationship between the second wire 3 and the third wire 4, and the connection relationship between the first wire 2 and the fourth wire 6. Furthermore, the light emitting substrate includes eight rows and eight columns of light emitting units, the second wire 3 of every other three rows of light emitting units 10 is connected to the same third wire 4, and the first wires 2 of every four adjacent rows of the light emitting units 10 are connected to one fourth wire 6, which is taken as an example for illustration. However, the embodiment of the present disclosure is not limited to this case. In a specific implementation method, the light emitting substrate can also include other numbers of rows and columns of the light emitting units, or every other number of light emitting units may be connected to the same third wire 4, and the first wires 2 of other number of light emitting units may be connected to one fourth wire 6, which can be flexibly arranged according to requirements in the specific implementation method.

Specifically, as shown in FIG. 11, the light emitting substrate can include at least one light emitting element driver (LED driver). The LED driver includes a plurality of signal channels, and at least part of the signal channels of all LED drivers are in one-to-one correspondence with a plurality of third wires 4. Specifically, an anode signal (for example, it can also be a cathode signal) can be transmitted through the fourth wire 6 to the first wire 2 connected to the fourth wire 6, that is, the signal can be transmitted to four rows of light emitting units 10 through one fourth wire 6. Signals are sequentially transmitted to a plurality of fourth wires 6 on the light emitting substrate in a time-sharing manner, so that signals are sequentially transmitted to a plurality of rows of light emitting units 10 on the light emitting substrate, and are transmitted to four rows of light emitting units each time. Specifically, for example, the anode signal is firstly input to the first group of light emitting units 10 through the first-sequence fourth wire 6, and during this period, the corresponding cathode signal data (or example, it can also be anode signal data) is output to each of the light emitting units 10 in this group of light emitting units 10 through all the third wires 4, and the signals output to different light emitting units 10 can be different, thus realizing independent control of a single light emitting unit 10. After the lighting of all the light emitting units 10 in the first group of light emitting units 10 is completed, the anode signal of this group of light emitting units 10 are turned off. Then, the anode signal is input to the second group of light emitting units 10 through the second-sequence fourth wire 6, and during this period, the corresponding cathode signal data is output to each light emitting unit 10 in the second group of light emitting units 10 through all the wires 4. In this way, signals are sequentially loaded to the fourth wires 6 to complete the lighting control of all the light emitting units. It should be noted that the aforementioned one group of light emitting units 10 can include i rows of light emitting units 10, where i is a positive integer greater than or equal to 1. Further, the i rows of light emitting units 10 can be sequentially continuous i rows of light emitting units 10, or discontinuous i rows of light emitting units 10. Due to the need for control as mentioned above, in a column of light emitting units 10, several light emitting units 10 corresponding to one fourth wire 6 correspond to different third wires 4, so that independent control of the light emitting units 10 can be realized.

In a possible implementation method, the first wire 2 and the second wire 3 can be located in the first wiring layer T; and the third wire 4 can be located in the second wiring layer B. Specifically, the fourth wire 6 can be located in the second wiring layer B.

In a possible implementation method, as shown in FIG. 9, the light emitting substrate further includes a fifth wire 5 located in the same light emitting element string S and connecting two light emitting elements 100 in series, and the fifth wire 5 is located in the first wiring layer T.

In a possible implementation method, as shown in FIG. 4 or FIG. 9, the first wiring layer T further includes an alignment hollow block T adjacent to at least part of the light emitting elements 100. Specifically, the alignment hollow block T can be formed in the fifth wire 5. In the embodiment of the present disclosure, the first wiring layer T further includes an alignment hollow block T adjacent to at least part of the light emitting elements 100, the alignment hollow block T can be used for, when transferring the light emitting elements 100 onto the wiring substrate (light emitting substrate without light emitting elements), the alignment between the transfer device and the wiring substrate, so as to accurately transfer the light emitting elements 100 onto the wiring substrate. Setting the alignment hollow block T in the first wiring layer T can omit setting marks specially used for alignment at other positions of the light emitting substrate, which can save space on the light emitting substrate.

Specifically, the alignment hollowed block T can be a regular pattern formed by partially removing material from the fifth wire 5. For example, the shape of the orthographic projection (projection along a thickness direction of the substrate) of the alignment hollowed block T on the substrate can be rectangular, or it can be other patterns convenient for alignment, which is not limited in the present disclosure. The fifth wire 5 can have a block structure, and only when the area of the orthographic projection of the fifth wire 5 is greater than a preset threshold, will the alignment hollow block T be provided. Further, a ratio of the area of the orthographic projection of the alignment hollow block T on the substrate to the area of the orthographic projection of the fifth wire 5 for forming the alignment hollow block T is less than or equal to 20%, thus avoiding the problem that the resistance value of the fifth wire 5 after the alignment hollow block T is formed changes too much compared with the wire before the alignment hollow block T is formed and affects the luminous brightness of the light emitting element string. The preset threshold is related to the region size of the light emitting unit and the size of the light emitting element, and can be set according to specific situations. Specifically, in a light emitting unit 10, at least one fifth wire 5 is provided with at least one alignment hollow block T, and at least one fifth wire 5 is not provided with the alignment hollow block T.

Figure 6:
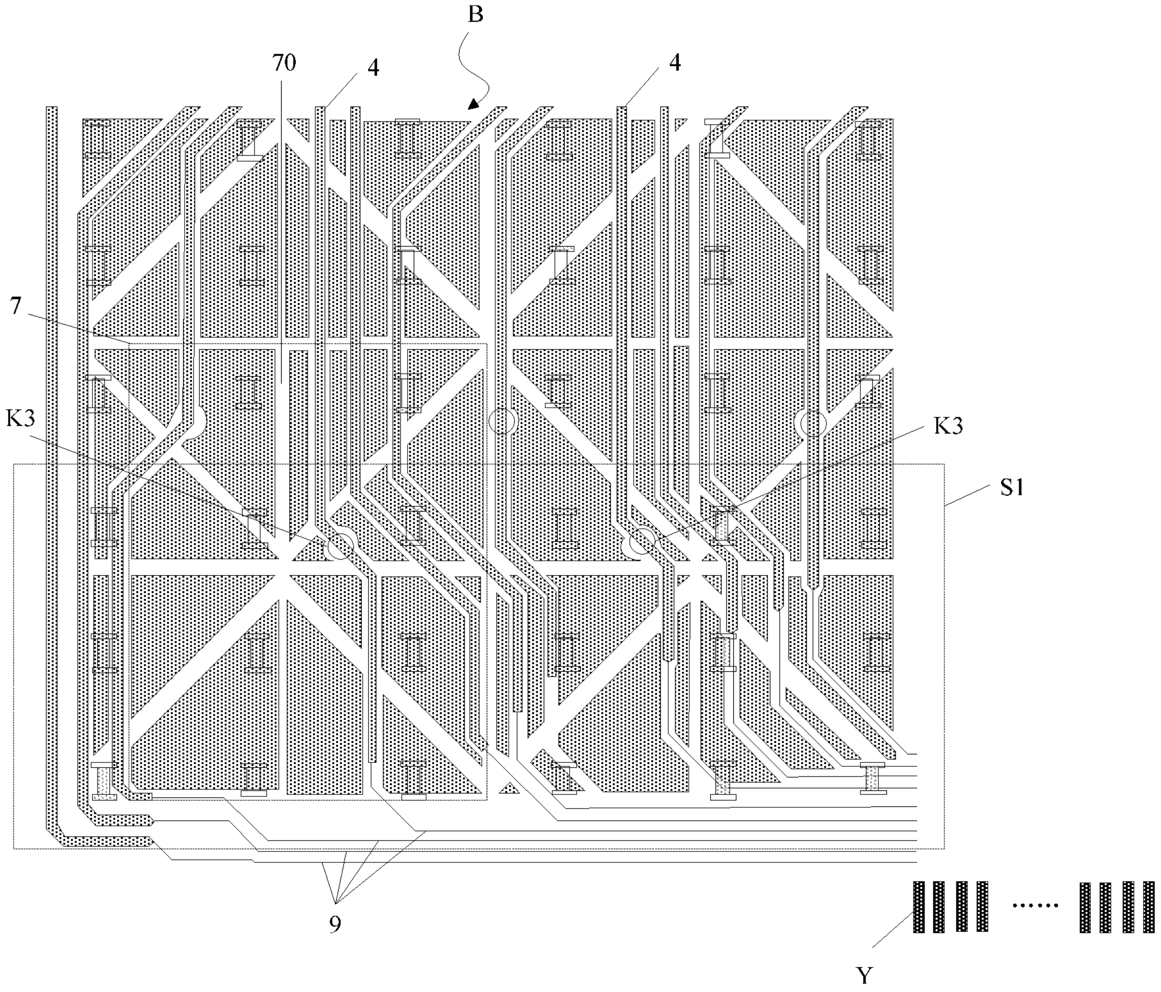
FIG. 6 is a partial schematic diagram of a second wiring layer corresponding to FIG. 4.
Figure 7:
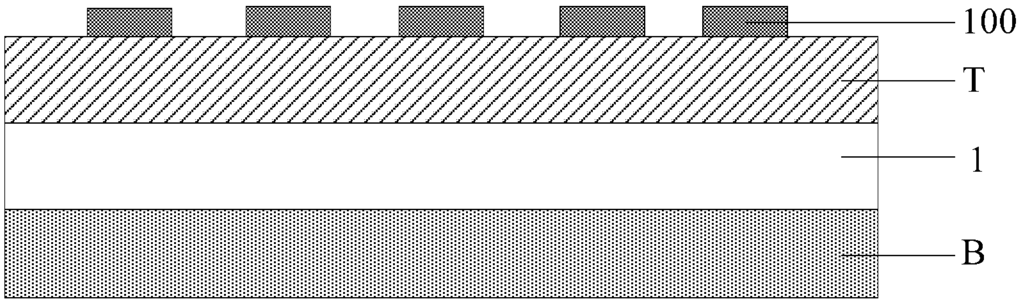
FIG. 7 is a cross-sectional schematic diagram of a light emitting substrate provided by an embodiment of the present disclosure.

In a possible embodiment, referring to FIG. 6 or FIG. 10, FIG. 6 is a schematic wiring diagram of the second wiring layer corresponding to FIG. 4, and FIG. 10 is a schematic wiring diagram of the second wiring layer in FIG. 8. The second wiring layer B further includes a plurality of heat dissipation blocks 7 separated from each other, and the heat dissipation blocks are provided with grid-shaped hollow grooves 70. Specifically, the hollow grooves 70 can penetrate the second wiring layer B. In the embodiment of the present disclosure, the second wiring layer B further includes a plurality of heat dissipation blocks 7 separated from each other, so as to dissipate heat from the light emitting substrate; and the grid-shaped hollow grooves 70 can increase the gaps within the heat dissipation blocks 7, so as to avoid deformation of the light emitting substrate caused by thermal expansion of the heat dissipation blocks 7.

In a possible implementation method, as shown in FIGS. 4 and 6, the light emitting substrate includes a plurality of bonding terminals Y located on one side of the substrate 1; the light emitting substrate includes a first light emitting unit row S1 closest to the bonding terminals Y; the first wiring layer T further includes a lead-out wire 8 located between two adjacent light emitting units 10 in the first light emitting unit row S1 and connected to the second wire 3, and the lead-out wire 8 is electrically connected to the third wire 4 through a third via K3 penetrating the substrate 1. In this way, it can avoid the problem that the second wire 3 in the first light emitting unit row S cannot be directly connected to the third wire 4, when the second wiring layer B needs to be provided with a plurality of leads 9 in a region close to the bonding terminals Y and the leads 9 occupy a large area where the first light emitting unit row S is located. Specifically, the lead 9 can electrically connect the third wire 4 and the bonding terminal Y.

In a possible implementation method, the area of the hollow grooves 70 can account for one tenth to one third of the area of the heat dissipation blocks 7. In this way, the light emitting substrate has better heat dissipation performance while meeting the wiring requirements.

In a possible implementation method, the wires in the second wiring layer B are arranged in the same layer as the heat dissipation blocks 7, and the orthographic projections of the wires in the second wiring layer B on the substrate 1 at least partially overlaps with the orthographic projections of the hollow grooves 70 on the substrate.

In a possible implementation method, the material of the heat dissipation blocks 7 is a conductive material, and the heat dissipation blocks 7 are insulated from the wires in the second wiring layer B. Specifically, for example, gaps can be provided between the wires in the second wiring layer B and the heat dissipation blocks 7. Specifically, the heat dissipation blocks 7 are made of the same material as the second wiring layer B. Specifically, the material of the second wiring layer B can be copper.

In a possible implementation method, a plurality of hollow grooves 70 in at least some regions are distributed in a cross and saltire shape, so as to have better heat dissipation effect.

Figure 12:
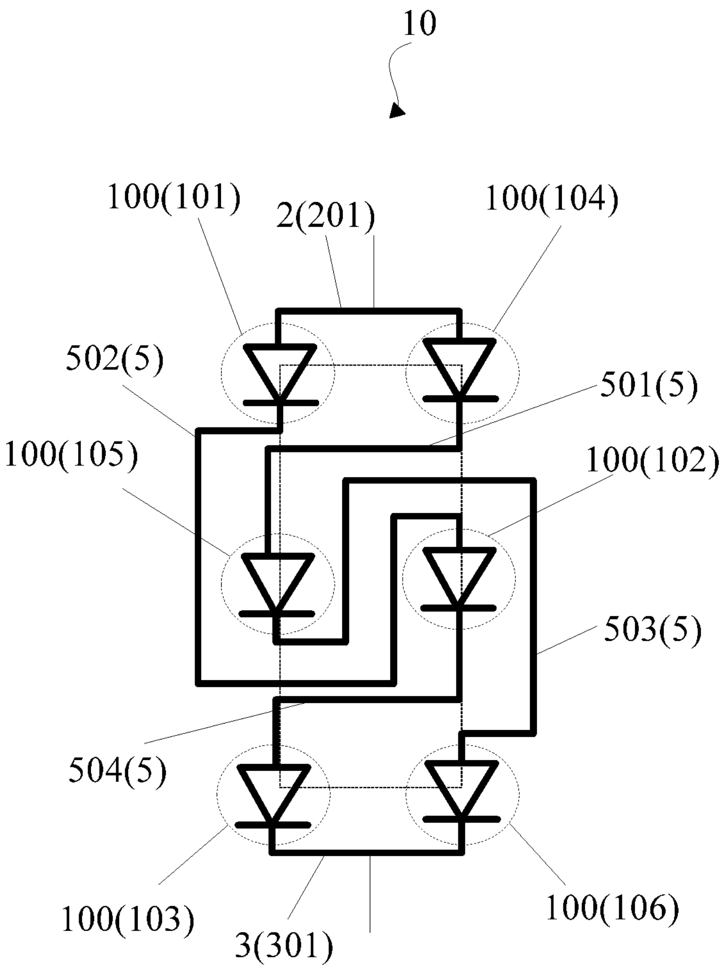
FIG. 12 is a schematic diagram of an arrangement of three rows and two columns of light emitting elements included in a light emitting unit.

In order to more clearly understand the arrangement manner and connection manner of the light emitting elements 100 in the light emitting unit 10 provided by the embodiment of the present disclosure, further detailed descriptions are given below by way of specific examples as follows:

For example, as shown in FIG. 12, the light emitting unit includes two light emitting element strings S, and each of the light emitting element strings S includes three light emitting elements 100; the six light emitting elements 100 of the same light emitting unit 10 form a rectangle, four light emitting elements 100 are located at four vertices of the rectangle, and the other two light emitting elements 100 are located at two midpoints of the long sides of the rectangle, respectively; in the same light emitting element string S, two light emitting elements 100 are located at two vertices of one long side of the rectangle, the other light emitting element 100 is located at the midpoint of the other long side of the rectangle.

One of the light emitting element strings S includes a first light emitting element 101 and a third light emitting element 103 respectively located at two vertices of one long side of the rectangle, and a second light emitting element 102 located at the midpoint of the other long side of the rectangle; the other light emitting element string S includes a fourth light emitting element 104, a fifth light emitting element 105 and a sixth light emitting element 106; the first light emitting element 101 and the fourth light emitting element 104 are located in the same row, the second light emitting element 102 and the fifth light emitting element 106 are located in the same row, and the third light emitting element 103 and the sixth light emitting element 106 are located in the same row. In a possible implementation method, the anode of the first light emitting element 101 is located on one side away from the fifth light emitting element 105, the anode of the fourth light emitting element 104 is located on one side away from the second light emitting element 102, the anode of the fifth light emitting element 105 is located on one side away from the third light emitting element 103, the anode of the second light emitting element 102 is located on one side away from the sixth light emitting element 106, the anode of the third light emitting element 103 is located on one side facing the fifth light emitting element 105, and the anode of the sixth light emitting element 106 is located on one side facing the second light emitting element 102;

The light emitting substrate further includes: a first anode connection line 201 connecting the anode of the first light emitting element 101 and the anode of the fourth light emitting element 104; a first series connection line 501 connecting the cathode of the fourth light emitting element 104 and the anode of the fifth light emitting element 105 within the interior of the rectangle; a second series connection line 502 located at one side of the fifth light emitting element 105 away from the first series connection line 501, surrounding the fifth light emitting element 105, and connecting the cathode of the first light emitting element 101 and the anode of the second light emitting element 102; a third series connection line 503 located between the first series connection line 501 and the second series connection line 502, surrounding the second light emitting element 102, and connecting the cathode of the fifth light emitting element 105 and the anode of the sixth light emitting element 106; a fourth series connection line 504 connecting the cathode of the second light emitting element 102 and the anode of the third light emitting element 103; and a first cathode connection line 301 connecting the cathode of the third light emitting element 103 and the cathode of the sixth light emitting element 106.

Figure 13:
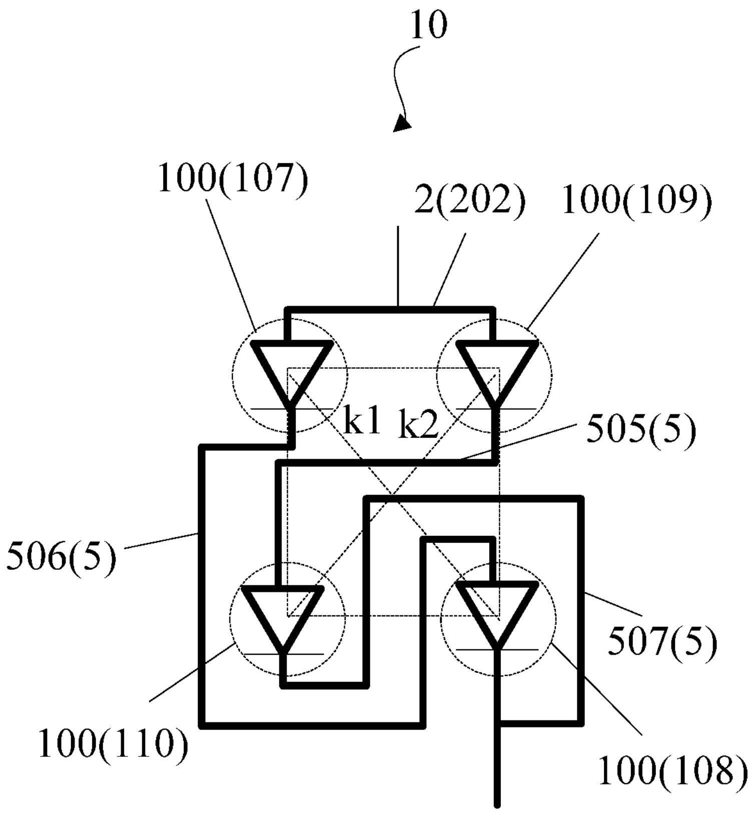
FIG. 13 is a schematic diagram of an arrangement of two rows and two columns of light emitting elements included in a light emitting unit.

For another example, as shown in FIG. 13, the light emitting unit 10 includes two light emitting element strings S, and each of the light emitting element string S includes two light emitting elements 100; the four light emitting elements 100 of the same light emitting unit 10 form a rectangle, and the four light emitting elements 100 are located at four vertices of the rectangle; and the two light emitting elements 100 of the same light emitting element string S are respectively located at the vertices through which the diagonal of the rectangle passes.

Specifically, the light emitting unit 10 includes a seventh light emitting element 107 and an eighth light emitting element 108 located on the first diagonal line k1 of the rectangle, and a ninth light emitting element 109 and a tenth light emitting element 110 located on the second diagonal line k2 of the rectangle; the seventh light emitting element 107 and the ninth light emitting element 109 are located in the same row, and the eighth light emitting element 108 and the tenth light emitting element 110 are located in the same row. In a possible implementation method, the anode of the seventh light emitting element 107 is located on one side away from the tenth light emitting element 110, the anode of the ninth light emitting element 109 is located on one side away from the eighth light emitting element 108, the anode of the tenth light emitting element 110 is located on one side facing the seventh light emitting element 107, and the anode of the eighth light emitting element 108 is located on one side facing the ninth light emitting element 109;

The light emitting substrate further includes: a second anode connection line 202 connecting the anode of the seventh light emitting element 107 and the anode of the ninth light emitting element 109; a fifth series connection line 505 connecting the cathode of the ninth light emitting element 109 and the anode of the tenth light emitting element 110 within the interior of the rectangle; a sixth series connection line 506 located at one side of the tenth light emitting element 110 away from the eighth light emitting element 108, surrounding the tenth light emitting element 110, and connecting the cathode of the seventh light emitting element 107 and the anode of the eighth light emitting element 108; and a seventh series connection line 507 located between the fifth series connection line 505 and the sixth series connection line 506, surrounding the eighth light emitting element 108, and connecting the cathode of the tenth light emitting element 110 and the cathode of the eighth light emitting element 108.

Figure 14:
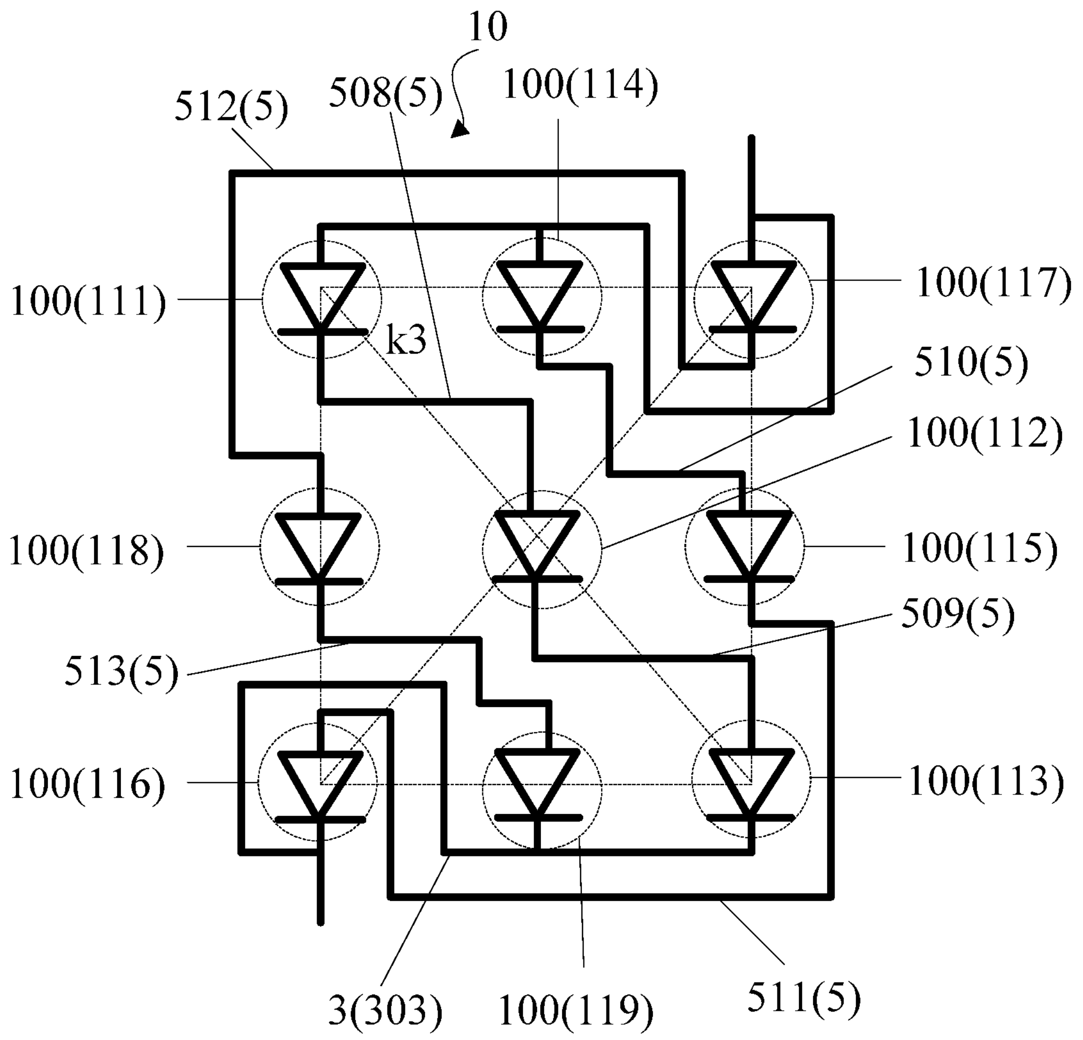
FIG. 14 is a schematic diagram of an arrangement of three rows and three columns of light emitting elements included in a light emitting unit.

For another example, as shown in FIG. 14, the light emitting unit 10 includes three light emitting element strings S, and each of the light emitting element strings includes three light emitting elements 100; the nine light emitting elements 100 of the same light emitting unit 10 form a rectangle, four light emitting elements 100 are located at four vertices of the rectangle, another four light emitting elements 100 are located at the midpoints of four sides of the rectangle, and the remaining light emitting element 100 is located at the center of the rectangle;

Specifically, in one light emitting element string S, three light emitting elements 100 are respectively located at the two vertices through which a third diagonal k3 of the rectangle passes and at the midpoint of the third diagonal k3; in another light emitting element string S, two light emitting elements 100 are located at the midpoints of two sides of the rectangle on one side of the third diagonal k3, and the other light emitting element 100 is located at the vertex of the rectangle on the other side of the third diagonal k3; in the remaining light emitting element string S, one light emitting element 100 is located at the vertex of the rectangle on one side of the third diagonal k3, and the other two light emitting elements 100 are located at the midpoints of two sides of the rectangle on the other side of the third diagonal k3.

Specifically, the light emitting unit 10 includes: an eleventh light emitting element 111, a twelfth light emitting element 112 and a thirteenth light emitting element 113 sequentially located on the third diagonal k3 and connected in series; a fourteenth light emitting element 114 and a fifteenth light emitting element 115 located on one side (e.g., the right side) of the third diagonal k3 and connected in series, and a sixteenth light emitting element 116 located on the other side (e.g., the left side) of the third diagonal k3 and connected in series with the fifteenth light emitting element 115; and a seventeenth light emitting element 117 located on one side (e.g., the right side) of the third diagonal k3 and at the vertex of the rectangle, and an eighteenth light emitting element 118 and a nineteenth light emitting element 119 located on the other side (e.g., the left side) of the third diagonal k3 and sequentially connected in series with the seventeenth light emitting element 117;

The light emitting substrate includes: an eighth series connection line 508 connecting the cathode of the eleventh light emitting element 111 and the anode of the twelfth light emitting element 112 within the interior of the rectangle; a ninth series connection line 509 connecting the cathode of the twelfth light emitting element 112 and the anode of the thirteenth light emitting element 113 within the interior of the rectangle; a tenth series connection line 510 located at one side of the eighth series connection line 508 and connecting the cathode of the fourteenth light emitting element 114 and the anode of the fifteenth light emitting element 115; an eleventh series connection line 511 located at one side of the ninth series connection line 509, surrounding the thirteenth light emitting element 113 and the nineteenth light emitting element 119, and connecting the cathode of the fifteenth light emitting element 115 and the anode of the sixteenth light emitting element 116; a twelfth series connection line 512, surrounding the fourteenth light emitting element 114 and the eleventh light emitting element 111, and connecting the cathode of the seventeenth light emitting element 117 and the anode of the eighteenth light emitting element 118; a thirteenth series connection line 513 located between the ninth series connection line 509 and the eleventh series connection line 511, and connecting the cathode of the eighteenth light emitting element 118 and the anode of the nineteenth light emitting element 119; and a third cathode connection line 303 located between the eleventh series connection line 511 and the thirteenth series connection line 513, surrounding the sixteenth light emitting element 116, and connecting the cathode of the thirteenth light emitting element 113, the cathode of the nineteenth light emitting element 119 and the cathode of the sixteenth light emitting element 116.

Specifically, the fifth wire 5 can include the first series connection line 501, the second series connection line 502, the third series connection line 503, the fourth series connection line 504, the fifth series connection line 505, the sixth series connection line 506, the seventh series connection line 507, the eighth series connection line 508, the ninth series connection line 509, the tenth series connection line 510, the eleventh series connection line 511, the twelfth series connection line 512 and the thirteenth series connection line 513.

Figure 15:
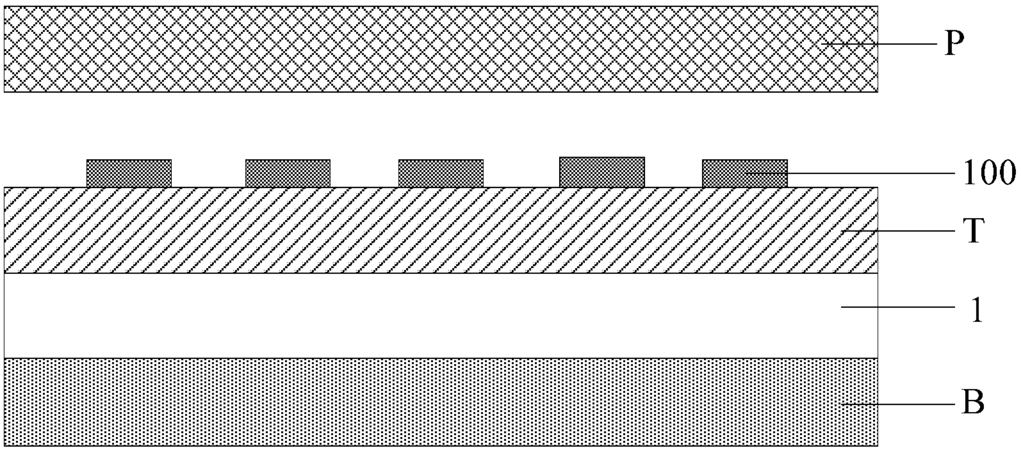
FIG. 15 is a schematic diagram of a display device provided by an embodiment of the present disclosure.

An embodiment of the present disclosure further provides a display device. As shown in FIG. 15, the display device includes the light emitting substrate provided by the embodiment of the present disclosure, and further includes a display panel P located at a light exiting side of the light emitting substrate.

Figure 16:
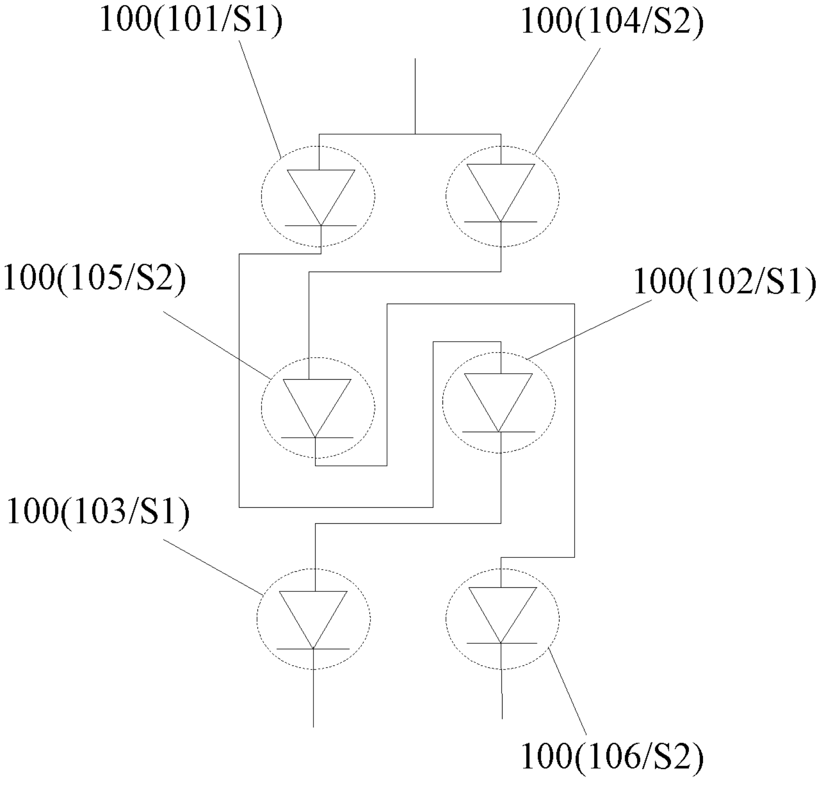
FIG. 16 is a schematic diagram of distribution of light emitting elements of another light emitting substrate provided by an embodiment of the present disclosure.

An embodiment of the present disclosure further provides another light emitting substrate. As shown in FIG. 16, the light emitting substrate includes a substrate and at least two light emitting element strings on the substrate. For example, as shown in FIG. 16, the at least two light emitting element strings include a first light emitting element string S1 and a second light emitting element string S2, and the same light emitting element string includes at least two light emitting elements 100 sequentially connected in series. Specifically, for example, in FIG. 16, the first light emitting element string S1 includes a first light emitting element 101, a second light emitting element 102 and a third light emitting element 103 sequentially connected in series, and the second light emitting element string S2 includes a fourth light emitting element 104, a fifth light emitting element 105 and a sixth light emitting element 106 sequentially connected in series. The plurality of light emitting elements 100 included in at least two light emitting element strings are distributed in an array, and at least two light emitting elements 100 connected in series are located in different rows and different columns. Specifically, for example, the first light emitting element 101 and the second light emitting element 102 connected in series are located in different rows and different columns. In this way, when the at least two light emitting element strings are energized with the same signal, the brightness in the controlled region can be made uniform. Specifically, as shown in FIG. 16, the output terminals of the two light emitting element strings may not be connected to each other, that is, the cathode of the third light emitting element 103 and the cathode of the sixth light emitting element 106 may not be connected to each other and can be independently controlled. Specifically, as shown in FIG. 16, the input terminals of the two light emitting element strings can be connected to each other, that is, the anode of the first light emitting element 101 and the anode of the fourth light emitting element 104 can be connected to each other; specifically, the input terminals of the two light emitting element strings may not be connected to each other and can be independently controlled.

In the embodiment of the present disclosure, the plurality of light emitting elements 100 in the same light emitting unit 10 are distributed in an array, and the same light emitting unit 10 includes at least two light emitting elements 100 connected in series and located in different rows, and further includes at least two light emitting elements 100 connected in series and located in different columns, so that any two adjacent light emitting elements 100 in the same light emitting element string S can be located in different rows and different columns. Because the current of the same light emitting element string S is the same, even if the phenomenon of current imbalance occurs to different light emitting element strings S, the arrangement manner of the light emitting elements 100 provided by the embodiment of the present disclosure can ensure that light emitting elements 100 with different brightness will not be clustered together to form regular bright and dark stripes, but the light emitting elements 100 with different brightness are in a disperse distribution, thus greatly improving the problem of uneven brightness in the same light emitting unit 10.

While preferred embodiments of the present invention have been described, additional changes and modifications to these embodiments may be made by those skilled in the art once they are aware of basic inventive concepts. Therefore, the appended claims are intended to be construed to include the preferred embodiments and all changes and modifications that fall within the scope of the present invention.

Obviously, those skilled in the art can make various changes and modifications to the embodiments of the present invention without departing from the spirit and scope of the embodiments of the present invention. Thus, provided that these changes and modifications of the embodiments of the present invention fall within the scope of the claims of the present invention and their equivalents, the present invention is also intended to cover such changes and modifications.

The invention claimed is:

1. A light emitting substrate, comprising:

a substrate; and a plurality of light emitting units on the substrate, wherein at least one of the plurality of light emitting units comprises at least two light emitting element strings, and the at least two light emitting element strings are connected in parallel with each other; and a same light emitting element string comprises at least two light emitting elements sequentially connected in series, wherein, in a same light emitting unit, a plurality of light emitting elements are distributed in an array, and the same light emitting unit comprises at least two light emitting elements connected in series and located in different rows, and further comprises at least two light emitting elements connected in series and located in different columns, wherein, in each of the plurality of light emitting units, one of a cathode or an anode of a light emitting element at a start of each of the light emitting element strings is connected to a first wire, and the other of a cathode or an anode of a light emitting element at an end of each of the light emitting element strings is connected to a second wire, first wires corresponding to at least two light emitting units are electrically connected, and second wires corresponding to at least two light emitting units are electrically connected through a third wire.

2. The light emitting substrate according to claim 1, wherein, in the same light emitting unit, at least one column of light emitting elements comprise at least one light emitting element of a first light emitting element string and at least one light emitting element of a second light emitting element string, and the first light emitting element string and the second light emitting element string are different light emitting element strings in the same light emitting unit.

3. The light emitting substrate according to claim 1, wherein, in the same light emitting unit, at least one row of light emitting elements comprise at least one light emitting element of a third light emitting element string and at least one light emitting element of a fourth light emitting element string, and the third light emitting element string and the fourth light emitting element string are different light emitting element strings in the same light emitting unit.

4. The light emitting substrate according to claim 1, wherein, in the same light emitting unit, counts of light emitting elements of different light emitting element strings are the same, and a light emitting element at a start of each of the light emitting element strings is located in a same row or in a same column.

5. The light emitting substrate according to claim 4, wherein, in the same light emitting unit, a distance between any two adjacent light emitting elements in any row of light emitting elements along a row direction is equal; and/or, in the same light emitting unit, a distance between any two adjacent light emitting elements in any column of light emitting elements along a column direction is equal.

6. The light emitting substrate according to claim 1, wherein at least one of the light emitting element strings comprises at least two light emitting elements sequentially connected in series, and any two adjacent light emitting elements in at least one of the light emitting element strings are located in different rows and different columns.

7. The light emitting substrate according to claim 6, wherein the same light emitting unit comprises N light emitting element strings;

the N light emitting element strings are formed as a light emitting element array with N columns and M rows, where N≥2, M≥2 and M≥N, and each column of light emitting elements comprises at least one light emitting element of each of the light emitting element strings; or, the N light emitting element strings are formed as a light emitting element array with N rows and M columns, where N≥2, M≥2 and M≥N, and each row of light emitting elements comprises at least one light emitting element of each of the light emitting element strings.

8. The light emitting substrate according to claim 1, wherein, in the same light emitting unit, a row direction and a column direction defined by the light emitting elements are perpendicular to each other.

9. The light emitting substrate according to claim 1, wherein the plurality of the light emitting units are arranged in an array, a row direction of an array arrangement of the light emitting units is parallel to a row direction of the light emitting elements in the light emitting units, and a column direction of the array arrangement of the light emitting units is parallel to a column direction of the light emitting elements in the light emitting units.

10. The light emitting substrate according to claim 9, wherein, in a light emitting element array formed by the light emitting elements of the plurality of light emitting units, a distance between two adjacent light emitting elements in any column along the column direction is equal, and a distance between two adjacent light emitting elements in any row along the row direction is equal.

11. The light emitting substrate according to claim 1, wherein, among the light emitting units located in a same row, first wires corresponding to all the light emitting units are a same wire.

12. The light emitting substrate according to claim 11, wherein, among the light emitting units in a same column, second wires corresponding to at least two light emitting units are electrically connected to a same third wire.

13. The light emitting substrate according to claim 12, wherein first wires corresponding to at least two rows of light emitting units are connected to a same fourth wire, the fourth wire comprises a first extension portion extending along a column direction, and a size of the fourth wire along a row direction is greater than a size of the third wire along the row direction.

14. The light emitting substrate according to claim 13, wherein the first wire comprises a portion extending along the row direction, the third wire comprises a portion extending along the column direction, and a size of the first wire along the column direction is greater than the size of the third wire along the row direction.

15. The light emitting substrate according to claim 1, wherein the light emitting substrate comprises a first wiring layer located between the plurality of light emitting elements and the substrate, and further comprises a second wiring layer located at a side of the substrate away from the first wiring layer, wherein the first wire and the second wire are located in the first wiring layer, and the third wire is located in the second wiring layer.

16. The light emitting substrate according to claim 15, wherein the light emitting substrate further comprises a fifth wire located in a same light emitting element string and connecting two light emitting elements in series, and the fifth wire is located in the first wiring layer.

17. The light emitting substrate according to claim 15, wherein the first wiring layer further comprises an alignment hollow block adjacent to at least part of the plurality of light emitting elements.

18. A display device, comprising the light emitting substrate according to claim 1, and further comprising a display panel located at a light-exiting side of the light emitting substrate.

* * * * *